(12) United States Patent
Nakahara

(10) Patent No.: US 7,906,791 B2
(45) Date of Patent: Mar. 15, 2011

(54) SEMICONDUCTOR LIGHT EMITTING ELEMENT

(75) Inventor: Ken Nakahara, Kyoto (JP)

(73) Assignee: Rohm Co., Ltd. (JP)

( * ) Notice: Subject to any disclaimer, the term of this patent is extended or adjusted under 35 U.S.C. 154(b) by 540 days.

(21) Appl. No.: 11/916,868

(22) PCT Filed: Mar. 3, 2006

(86) PCT No.: PCT/JP2006/304102
§ 371 (c)(1),
(2), (4) Date: Dec. 7, 2007

(87) PCT Pub. No.: WO2006/132013
PCT Pub. Date: Dec. 14, 2006

(65) Prior Publication Data
US 2009/0267048 A1 Oct. 29, 2009

(30) Foreign Application Priority Data
Jun. 9, 2005 (JP) .................................. 2005-169056

(51) Int. Cl.
*H01L 33/00* (2010.01)
(52) U.S. Cl. ...... 257/98; 257/79; 257/103; 257/E33.068; 257/E33.074
(58) Field of Classification Search .............. 257/79, 257/94, 102–103, E33.074, 12, 13, 98, E33.002, 257/E33.005, E33.006, E33.067, E33.068, 257/E33.069
See application file for complete search history.

(56) References Cited

U.S. PATENT DOCUMENTS

| 5,889,295 | A | * | 3/1999 | Rennie et al. ................... 257/96 |
| 2004/0016936 | A1 | * | 1/2004 | Tanaka et al. ................... 257/98 |
| 2004/0089868 | A1 | * | 5/2004 | Hon et al. ....................... 257/79 |

FOREIGN PATENT DOCUMENTS

| CN | 1472826 | 2/2004 |
| JP | 2004-128445 | 4/2004 |
| JP | 2005-5679 | 1/2005 |
| JP | 2005-158788 | 6/2005 |
| JP | 2005158788 A * | 6/2005 |

(Continued)

OTHER PUBLICATIONS

Chinese Office Action for Chinese Patent Application No. 200680018108.7 mailed Oct. 17, 2008 with English Translation.

(Continued)

*Primary Examiner* — A. Sefer
*Assistant Examiner* — Ermias Woldegeorgis
(74) *Attorney, Agent, or Firm* — Cantor Colburn LLP

(57) ABSTRACT

Light extraction efficiency of a semiconductor light-emitting element is improved. A buffer layer, an n-type GaN layer, an InGaN emission layer, and a p-type GaN layer are laminated on a sapphire substrate in a semiconductor light-emitting element. A ZnO layer functioning as a transparent electrode is provided on the p-type GaN layer and concave portions are formed on a surface of the ZnO layer at two-dimensional periodic intervals. If a wavelength of light from the InGaN emission layer in the air is $\lambda$, an index of refraction of the ZnO layer at the wavelength $\lambda$ is $n_{z\lambda}$, and a total reflection angle at an interface between the ZnO layer and a medium in contact therewith is $\theta_z$, a periodic interval $L_z$ between adjacent concave portions is set in a range of $\lambda/n_{z\lambda} \leq L_z \leq \lambda/(n_{z\lambda} \times (1-\sin\theta_z))$.

8 Claims, 6 Drawing Sheets

FOREIGN PATENT DOCUMENTS

JP    2006-049855    2/2006

OTHER PUBLICATIONS

International Preliminary Report on Patentability for International Application No. PCT/JP2006/304102 mailed Dec. 11, 2007.

International Search Report for International Application No. PCT/JP2006/304102 mailed Apr. 25, 2006.

Notification of Reasons for Refusal for Patent Application No. 2005-169056 mailed Apr. 18, 2006.

* cited by examiner

SEMICONDUCTOR LIGHT EMITTING ELEMENT

CROSS REFERENCE TO RELATED APPLICATIONS

This is a U.S. national stage of application No. PCT/JP2006/304102, filed on 3 Mar. 2006. Priority under 35 U.S.C. §119(a) and 35 U.S.C. §365(b) is claimed from Japanese Application No. 2005-169056, filed 9 Jun. 2005, the disclosure of which is also incorporated herein by reference.

BACKGROUND OF THE INVENTION

1. Field of the Invention

The present invention relates to a semiconductor light-emitting element, and in particular, relates to a GaN based semiconductor light-emitting element.

2. Description of the Related Art

In recent years, a semiconductor light-emitting element using a GaN based semiconductor is known as a blue semiconductor light-emitting element. A white LED combining a blue semiconductor light-emitting element and a yellow luminous body has been in increasing demand to be used for LCD backlights of mobile phones and the like. Since the white LED has characteristics in lower power consumption and long life, it is expected to be used next as a light source replacing fluorescent lamps, incandescent lamps and the like.

A conventional GaN based semiconductor light-emitting element has a structure in which a GaN buffer layer, an n-type GaN layer, an emission layer, and a p-type GaN layer are sequentially grown as crystals on a sapphire substrate. However, such a conventional structure has a problem that a difference between an index of refraction of the p-type GaN layer and that of air or resin in contact with the p-type GaN layer is large and a total reflection angle at an interface between the p-type GaN layer and air or resin in contact with the p-type GaN layer becomes smaller. Therefore much light generated in the emission layer is totally reflected at the interface with air or resin in contact with the p-type GaN layer, thereby making light extraction inefficient.

If, for example, a semiconductor light-emitting element is emitting light in the air, the index of refraction of GaN is about 2.5 when the wavelength of light is 450 nm and therefore, the total reflection angle at the interface between the p-type GaN layer and air is small as much as about 24°. Light emitted from the emission layer and incident on the interface between the p-type GaN layer and air at an angle greater than the total reflection angle is totally reflected at the interface between the p-type GaN layer and air and thus cannot be extracted from the semiconductor light-emitting element.

A method of periodically forming unevenness on the p-type GaN layer at intervals comparable to the wavelength of luminous light has been proposed to handle the problem (See, for example, Patent Document 1). With this structure, the traveling direction of light emitted from the emission layer changes due to a diffraction effect caused by unevenness formed periodically and light is diffracted to angles at which total reflection does not occur, thereby improving light extraction efficiency of a semiconductor light-emitting element.

In order to form such unevenness formed periodically on the p-type GaN layer, a resist is first formed on the p-type GaN layer grown as a crystal and then a resist pattern is formed by interference exposure method or the like. Then, portions not covered by the resist pattern are removed by dry etching such as the RIE process to form unevenness on the p-type GaN layer.

Patent Document 1: Japanese Patent Application (Laid Open) No. 2005-5679

However, if dry etching is performed to etch the p-type GaN layer, nitrogen holes are generated on the etched surface of the p-type GaN layer by plasma damage. Since such nitrogen holes act as a donor, a portion which has been converted to n-type will arise on the etched surface of the p-type GaN layer. If an n-type converted portion exists in part of the surface of the p-type GaN layer, the portion is + biased from the n side, though an n/p junction exists, and thus reverse-biased, resulting in an increased forward voltage of the semiconductor light-emitting element. In addition, an electric current injected into the emission layer of the n-type converted portion decreases, and further the current is not spread because resistance of the p-type GaN layer is high, resulting in a reduced effective luminous area of the semiconductor light-emitting element.

Thus, the n-type converted portion of the p-type GaN layer must be removed by wet etching or the like, but wet etching of GaN is difficult to perform and it is hard to remove the n-type converted portion completely and also manufacturing costs increase since the number of manufacturing processes increases.

SUMMARY OF THE INVENTION

The present invention has been made in view of the above circumstances and a general purpose thereof is to provide a semiconductor light-emitting element whose light extraction efficiency has been improved.

To solve the above problems, a semiconductor light-emitting element according to an embodiment of the present invention is a semiconductor light-emitting element in which an n-type GaN layer, an emission layer, and a p-type GaN layer are laminated on a substrate, wherein an $Mg_xZn_{1-x}O$ layer ($0 \leq x \leq 0.5$) is provided on the p-type GaN layer and concave or convex portions are formed on the surface of the $Mg_xZn_{1-x}O$ layer ($0 \leq x \leq 0.5$) at two-dimensional periodic intervals.

According to this embodiment, concave or convex portions are formed on the surface of the $Mg_xZn_{1-x}O$ layer ($0 \leq x \leq 0.5$) at two-dimensional periodic intervals and thus, light from the emission layer is diffracted. Of all diffracted lights, a diffracted light incident on the interface between the $Mg_xZn_{1-x}O$ layer ($0 \leq x \leq 0.5$) and a medium in contact therewith at an angle smaller than the total reflection angle is not totally reflected and is extracted from the semiconductor light-emitting element. Since concave or convex portions are formed on the $Mg_xZn_{1-x}O$ layer ($0 \leq x \leq 0.5$), instead of the p-type GaN layer, plasma during dry etching is not directly exposed to the p-type GaN layer and n-type conversion due to damage does not occur on the surface of the p-type GaN layer. Therefore light extraction efficiency can be improved without causing the forward voltage to increase. In addition, a process of wet etching, which is conventionally necessary after dry etching, can be eliminated, thereby reducing manufacturing costs.

Concave or convex portions formed on the surface of the $Mg_xZn_{1-x}O$ layer ($0 \leq x \leq 0.5$) may be arranged into a tetragonal lattice or triangle lattice form. If arranged into a tetragonal lattice form, concave or convex portions can be formed at two-dimensional periodic intervals. If arranged into a triangle lattice form, the density of concave or convex portions formed at two-dimensional periodic intervals can be increased. Therefore light extraction efficiency can suitably be improved.

Another embodiment of the present invention is also a semiconductor light-emitting element. This semiconductor light-emitting element is a semiconductor light-emitting element in which a p-type GaN layer, an emission layer, and an n-type GaN layer are laminated and concave or convex portions are formed on a surface of the n-type GaN layer at two-dimensional periodic intervals.

According to this embodiment, concave or convex portions are formed on the surface of the n-type GaN layer at two-dimensional periodic intervals and thus, light from the emission layer is diffracted. Of all diffracted lights, a diffracted light incident on the interface between the n-type GaN layer and a medium in contact therewith at an angle smaller than the total reflection angle is not totally reflected and is extracted from the semiconductor light-emitting element. Nitrogen holes are also generated by performing dry etching on the n-type GaN layer, converting the surface of an n-type GaN layer 16 to the n type. However, the n-type GaN layer is originally of n type and thus is not reverse-biased. Therefore light extraction efficiency can be improved without the forward voltage being increased. Also in this case, a process of wet etching, which is conventionally necessary after dry etching, can be eliminated, thereby reducing manufacturing costs.

Concave or convex portions formed on the surface of the n-type GaN layer may be arranged into a tetragonal lattice or triangle lattice form. If arranged into a tetragonal lattice form, concave or convex portions can be formed at two-dimensional periodic intervals. If arranged into a triangle lattice form, the density of concave or convex portions formed at two-dimensional periodic intervals can be increased. Therefore light extraction efficiency can suitably be improved.

Still another embodiment of the present invention is also a semiconductor light-emitting element. This semiconductor light-emitting element is a semiconductor light-emitting element in which an n-type GaN layer, an emission layer, and a p-type GaN layer are laminated on a substrate, the substrate is an SiC substrate, and concave or convex portions are formed on the surface of the SiC substrate at two-dimensional periodic intervals.

According to this embodiment, concave or convex portions are formed on the surface of the SiC substrate at two-dimensional periodic intervals. Thus light emitted from the emission layer in the direction of the SiC substrate is diffracted. Light extraction efficiency can thereby be improved. Even if dry etching is performed on the SiC substrate, a problem of an increased forward voltage due to plasma damage does not occur and therefore, processing is easy.

Concave or convex portions formed on the surface of the SiC substrate may be arranged into a tetragonal lattice or triangle lattice form. If arranged into a tetragonal lattice form, concave or convex portions can be formed at two-dimensional periodic intervals. If arranged into a triangle lattice form, the density of concave or convex portions formed at two-dimensional periodic intervals can be increased. Therefore light extraction efficiency can suitably be improved.

An $Mg_xZn_{1-x}O$ layer ($0 \leq x \leq 0.5$) may be provided on the p-type GaN layer with concave or convex portions formed on the surface of the $Mg_xZn_{1-x}O$ layer ($0 \leq x \leq 0.5$) at two-dimensional periodic intervals. In this case, concave or convex portions are formed on the surface of the $Mg_xZn_{1-x}O$ layer ($0 \leq x \leq 0.5$) at two-dimensional periodic intervals. Thus light emitted from the emission layer in the direction of the $Mg_xZn_{1-x}O$ layer ($0 \leq x \leq 0.5$) is diffracted. Of all diffracted lights, a diffracted light incident on the interface between the $Mg_xZn_{1-x}O$ layer ($0 \leq x \leq 0.5$) and a medium in contact therewith at an angle smaller than the total reflection angle at the interface between the $Mg_xZn_{1-x}O$ layer ($0 \leq x \leq 0.5$) and a medium in contact therewith is not totally reflected and is extracted from the semiconductor light-emitting element.

Concave or convex portions formed on the surface of the $Mg_xZn_{1-x}O$ layer ($0 \leq x \leq 0.5$) may be arranged into a tetragonal lattice or triangle lattice form. If arranged into a tetragonal lattice form, concave or convex portions can be formed at two-dimensional periodic intervals. If arranged into a triangle lattice form, the density of concave or convex portions formed at two-dimensional periodic intervals can be increased. Therefore light extraction efficiency can suitably be improved.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
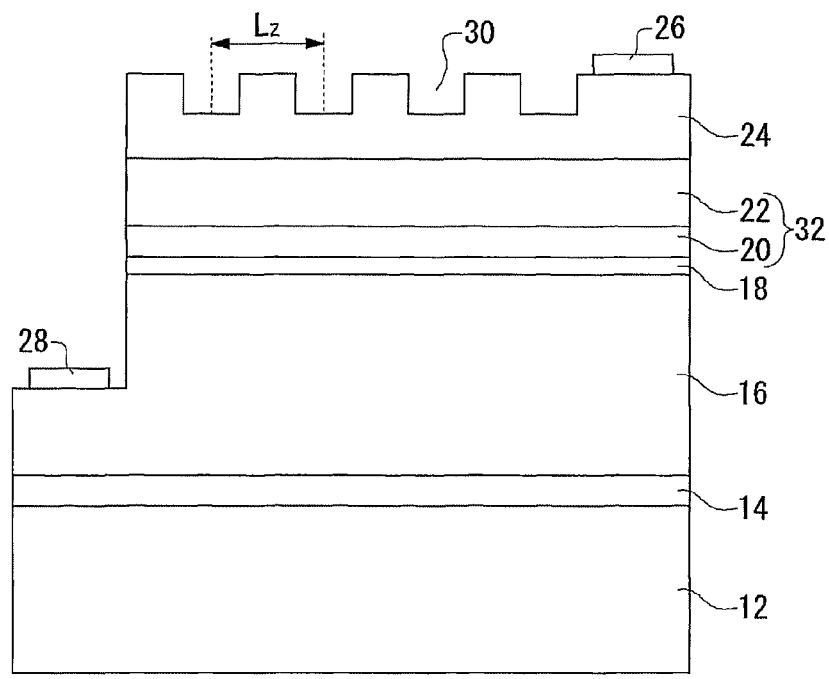
FIG. 1 is a cross-sectional view of a semiconductor light-emitting element according to a first embodiment of the present invention.

FIG. 1 is a cross-sectional view of a semiconductor light-emitting element according to a first embodiment of the present invention. As shown in FIG. 1, a semiconductor light-emitting element 10 is a GaN based semiconductor light-emitting element of a double heterostructure in which an n-type GaN layer 16, which is a contact layer, an InGaN emission layer 18, and a p-type GaN layer 32 consisting of a p-type AlGaN layer 20, which is a clad layer, and a p-type AlGaN layer 22, which is a contact layer, are laminated. An observation surface of light emission of the semiconductor light-emitting element 10 according to the first embodiment is a ZnO layer 24 side, which is a transparent electrode.

Incidentally, each drawing is intended to describe physical relationships among layers and thus, does not necessarily represent actual dimensional relationships. In each embodiment, the same reference numerals are attached to the same components or corresponding components, and description thereof is not repeated.

The semiconductor light-emitting element 10 is formed by epitaxially growing a GaN based semiconductor on a sapphire substrate 12.

A buffer layer 14 is provided on the sapphire substrate 12. The buffer layer 14 is an amorphous layer of AlGaN formed at low temperature of about 550° C. using the PLD (Pulsed Laser Deposition) process. The buffer layer 14 should have a thickness of about 10 to 20 nm. The buffer layer 14 is groundwork for growing a GaN film with good crystallinity on the sapphire substrate 12 and has a function as a buffer layer to prevent lattice defects due to a lattice misfit with the sapphire substrate 12 from increasing. The buffer layer 14 may be a crystalline buffer layer. In this case, AlGaN is grown as a crystal at about 800 to 1000° C. The thickness of a crystalline buffer layer is not particularly limited, but the thickness of about 10 to 100 nm is sufficient.

An n-type GaN layer 16 doped with Si using the MOCVD process is provided on the buffer layer 14. The n-type GaN layer 16 functions as a contact layer. The dopant may also be Ge. The temperature of the sapphire substrate 12 when forming the n-type GaN layer 16 is maintained at about 1000 to 1200° C. If the n-type GaN layer 16 is thin, sheet resistance of the n-type GaN layer 16 increases, thereby making operating voltage increase. Therefore, the n-type GaN layer 16 desirably has the thickness of about 3 to 10 µm. The n-type GaN layer 16 also has a function as an n-type clad layer.

An InGaN emission layer 18 is provided on the n-type GaN layer 16 using the MOCVD process. The temperature of the sapphire substrate 12 when forming the InGaN emission layer 18 is maintained at about 700 to 1000° C. The InGaN emission layer 18 has a multiple quantum well (MQW) structure in which an InGaN layer, and a GaN layer or an InGaN layer whose relative proportions of In is smaller than that of the luminous InGaN layer are alternately laminated. The number of wells may be 5 to 10. The InGaN layer has the thickness of about 1 to 10 nm and the GaN layer has the thickness of about 3 to 30 nm. For example, the InGaN layer has the thickness of 3 nm and the GaN layer has the thickness of 10 nm. If the relative proportions of In in the InGaN layer is increased, band gap energy will be smaller, thereby making a light emission peak wavelength longer. Thus, the light emission wavelength of the semiconductor light-emitting element 10 can be controlled by changing the relative proportions of In or thickness of the InGaN layer.

An undoped GaN layer (not shown) may be provided on the InGaN emission layer 18 using the MOCVD process. The undoped GaN layer has the thickness of about 10 to 100 nm. The undoped GaN layer functions as a protective layer, that is, has a function to prevent degradation of crystal of the InGaN emission layer 18 caused by high temperatures of the InGaN emission layer 18 during a process of crystal growth.

A p-type AlGaN layer 20 doped with Mg is provided on the InGaN emission layer 18. The p-type AlGaN layer 20 may be a p-type GaN layer. The p-type AlGaN layer 20 functions as a clad layer. The temperature of the sapphire substrate 12 when forming the p-type AlGaN layer 20 is maintained at about 1000 to 1200° C. The p-type AlGaN layer 20 has the thickness of 0.1 to 0.3 µm, for example, about 0.15 µm.

A p-type GaN layer 22 doped with Mg is provided on the p-type AlGaN layer 20. The p-type GaN layer 22 functions as a contact layer. The temperature of the sapphire substrate 12 when forming the p-type GaN layer 22 is maintained at about 700 to 1000° C. The p-type GaN layer 22 has the thickness of 20 nm to 0.2 µm.

A ZnO layer 24 doped with Ga using the PLD process is provided on the p-type GaN layer 22. The ZnO layer 24 may also be formed using the sol-gel process or the thermal CVD process. The ZnO layer 24 has the thickness of about 1 to 2 µm. The ZnO layer 24 has high transmittance for a luminous wavelength range of a GaN based semiconductor light-emitting element and thus functions as a transparent electrode. The ZnO layer 24 may be a $Mg_xZn_{1-x}O$ layer ($0 \leq x \leq 0.5$).

ITO (Indium Tin Oxide) is also widely known as a transparent electrode, but if ITO is formed by the sputtering method or the like, Sn contained in ITO acts as an n-type dopant for the p-type GaN layer 22. The surface of the p-type GaN layer 22 is converted to the n type, which causes a problem of an increased forward voltage of the semiconductor light-emitting element. Such a problem does not occur in the ZnO layer 24 used in the first embodiment because Zn becomes a p-type dopant for the p-type GaN layer 22. In addition, crystals of GaN and ZnO have the same wurtzite structure and therefore, it is easy to obtain a good interface.

Figure 2:
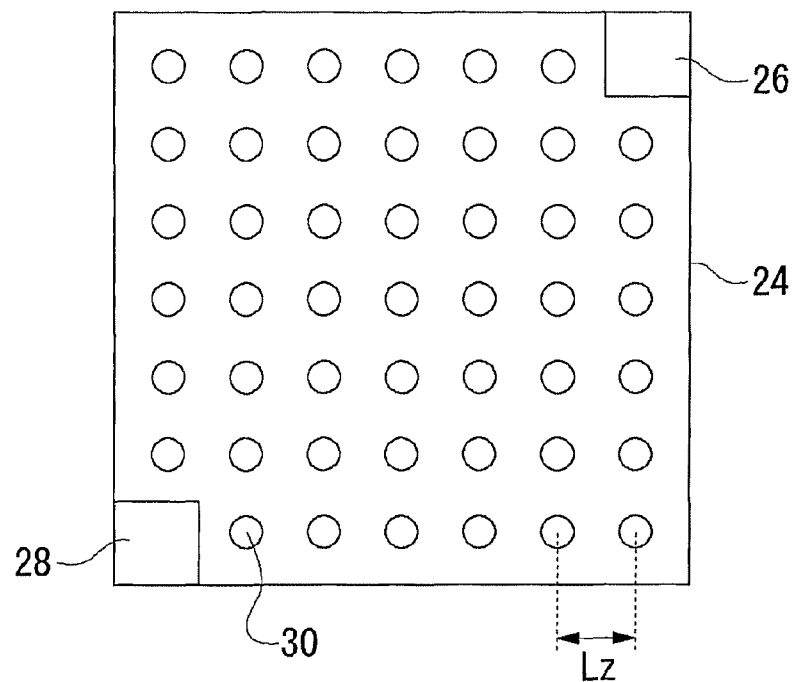
FIG. 2 is a diagram exemplifying an arrangement of concave portions.
Figure 3:
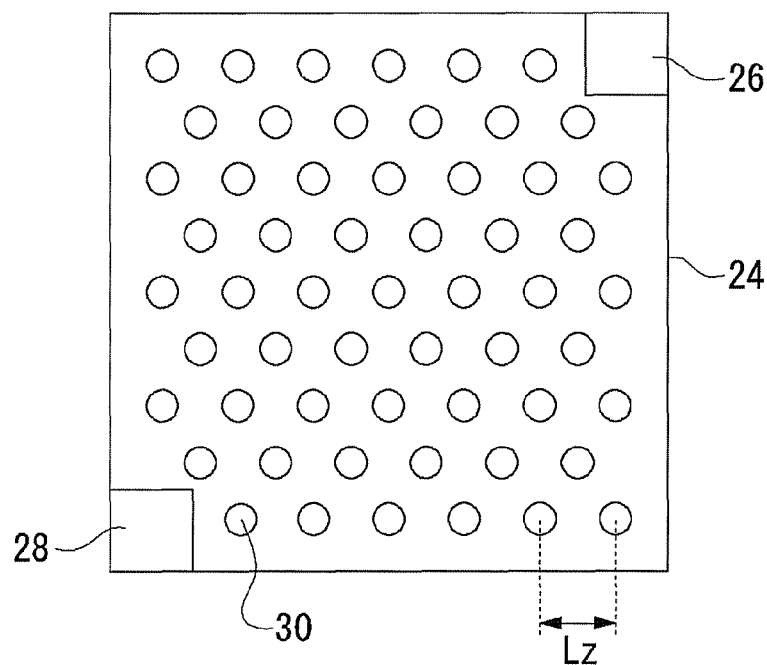
FIG. 3 is a diagram exemplifying another arrangement of concave portions.

A plurality of concave portions 30 are formed on the surface of the ZnO layer 24 at two-dimensional periodic intervals. The surface of the ZnO layer 24 refers to a surface opposite to the surface where the p-type GaN layer 22 and the ZnO layer 24 are in contact. FIG. 2 is a diagram exemplifying an arrangement of the concave portions 30. FIG. 3 is a diagram exemplifying another arrangement of the concave portions 30. The concave portions 30 may be arranged and formed, as shown in FIG. 2, like a tetragonal lattice. If arranged into a triangle lattice form, the concave portions 30 can be formed at two-dimensional periodic intervals. Also, the concave portions 30 may be arranged and formed, as shown in FIG. 3, like a triangle lattice. If arranged into a triangle lattice form, the density of the concave portions 30 formed at two-dimensional periodic intervals can be increased. Therefore light extraction efficiency can suitably be improved.

A plane view shape of the concave portions 30 may be circular, as shown, for example, in FIG. 2 or FIG. 3, or quadrilateral or hexagonal. The diameter thereof or the length of one side may be about 100 nm. The depth of the concave portions 30 may be about 500 nm. Suitable periodic intervals of the concave portions 30 will be described later.

The concave portions 30 are formed by forming a resist on the ZnO layer 24, patterning the resist to a desired shape using the electron beam exposure method, nano imprint method or the like, and performing dry etching of the RIE process or the like using the resist as a mask.

Subsequently, partial areas of the ZnO layer 24, p-type GaN layer 22, p-type AlGaN layer 20, InGaN emission layer 18, and n-type GaN layer 16 are removed by etching. The n-type GaN layer 16 is halfway etched and then an n-side electrode 28 is formed on the top surface of the exposed n-type GaN layer 16. The n-side electrode 28 is an ohmic contact, its contact specific resistance is desirably small with thermal stability, and Al or Ti/Al can suitably be used. To make the n-side electrode 28 an ohmic contact, it is desirable to perform sintering at about 600° C. after forming the n-side electrode 28. The n-side electrode 28 may have the thickness of about 2500 Å.

Lastly, a p-side electrode 26 is formed in a partial area on the ZnO layer 24 where no concave portion is provided. To realize an ohmic contact, the p-side electrode 26 can use Al, Ti, Ag and the like. The p-side electrode 26 may have the thickness of about 1000 Å for Pt and about 3000 Å for Au. The p-side electrode 26 and the n-side electrode 28 can be formed using the evaporation method, sputtering method or the like.

Figure 4:
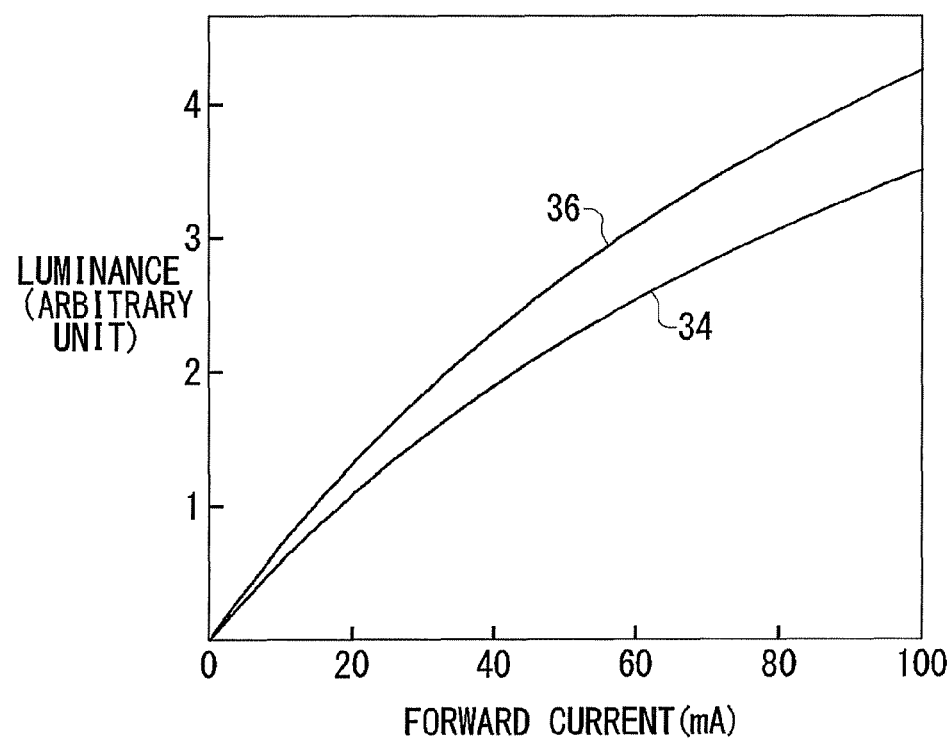
FIG. 4 is a diagram showing current-luminance properties of the semiconductor light-emitting element.

FIG. 4 is a diagram showing current-luminance properties of a semiconductor light-emitting element. The horizontal axis of FIG. 4 denotes the forward current of the semiconductor light-emitting element 10 and the vertical axis denotes the luminance. A curve 34 shows current-luminance properties when no concave portion 30 is formed on the surface of the ZnO layer 24. And a curve 36 shows current-luminance properties when the concave portions 30 are formed on the surface of the ZnO layer 24. As shown in FIG. 4, the luminance is improved by forming the concave portions 30 on the surface of the ZnO layer 24. This means that light extraction efficiency of the semiconductor light-emitting element 10 has been improved.

The semiconductor light-emitting element 10 according to the first embodiment has concave portions formed on the surface of the ZnO layer 24 at two-dimensional periodic intervals. Therefore light from the InGaN emission layer 18 is diffracted. Of all diffracted lights, a diffracted light incident on the interface at an angle smaller than the total reflection angle $\theta_z$ at the interface between the ZnO layer 24 and air is extracted from the semiconductor light-emitting element 10 without being totally reflected. Thus light extraction efficiency can be improved.

Since concave portions are formed on the ZnO layer 24, instead of the p-type GaN layer 22, of the semiconductor light-emitting element 10 according to the first embodiment, conversion of the surface of the p-type GaN layer 22 to the n type due to plasma damage during dry etching does not occur. Thus light extraction efficiency can suitably be improved without increasing the forward voltage.

Figure 5:
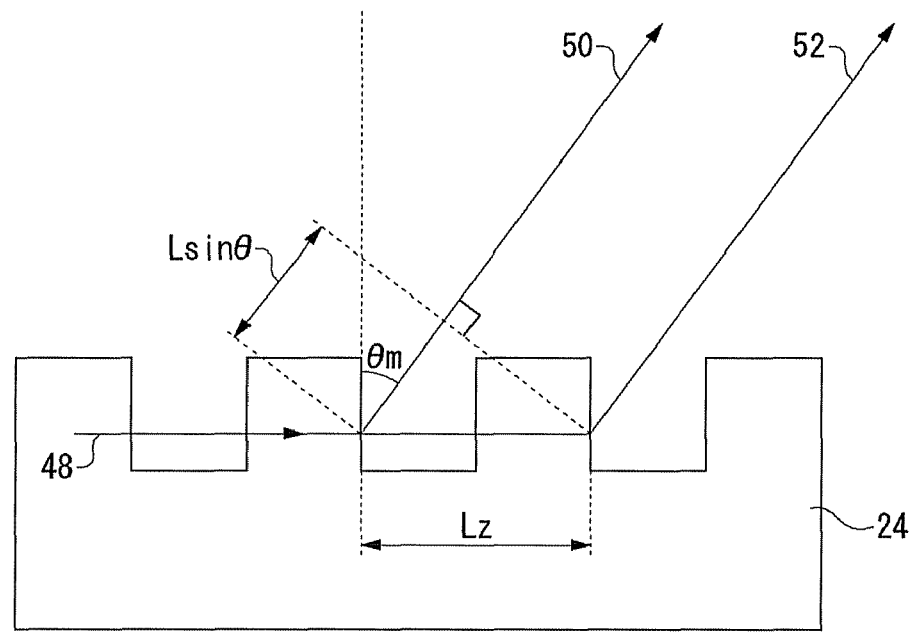
FIG. 5 is a diagram for describing periodic intervals of concave portions.

FIG. 5 is a diagram for describing periodic intervals of the concave portions 30. The periodic intervals of the concave portions 30 refer to intervals between centers of adjacent concave portions in a vertical or horizontal direction in a two-dimensional plane. It is assumed that the periodic interval is $L_z$, the peak wavelength of light from the InGaN emission layer 18 in the air is $\lambda$, the index of refraction of the ZnO layer 24 for the wavelength $\lambda$ is $n_{z\lambda}$, and the total reflection angle when light from the emission layer is incident on the interface between the ZnO layer 24 and air space is $\theta_z$. Since the total reflection angle $\theta_z$ is given by $\theta_z=\sin^{-1}(1/n_{z\lambda})$, if the index of refraction $n_{z\lambda}$ of ZnO is 2.3 and that of air is 1.0 when the wavelength $\lambda=450$ nm, the total reflection angle is about 25.8°.

In FIG. 5, a condition for mutually reinforcing a diffracted light 50 and a diffracted light 52 diffracted in the direction of $\theta_m$ with respect to the normal direction of the ZnO layer 24 from a light 48 being guided in the horizontal direction of the ZnO layer 24 can be represented as follows:

$$\frac{L_z}{\lambda/n_{z\lambda}}2\pi - \frac{L_z \sin\theta_m}{\lambda/n_{z\lambda}}2\pi = 2m\pi \quad (1)$$

wherein m is an integer and means the order of diffracted light. In the formula (1), the left side is a phase difference between the diffracted light 50 and the diffracted light 52. If the phase difference is an integral multiple of $2\pi$, the diffracted light 50 and the diffracted light 52 mutually reinforce. Transforming the formula (1) with regard to $L_z$ yields a formula (2) shown below:

$$L_z = \frac{m\lambda}{n_{z\lambda}(1-\sin\theta_m)} \quad (2)$$

If the angle $\theta_m$ at which the diffracted light 50 and the diffracted light 52 mutually reinforce is smaller than the total reflection angle $\theta_z$, that is, $\theta_m$ is in the range of $0 \leq \theta_m \leq \theta_z$, the diffracted light 50 and the diffracted light 52 that mutually reinforce are not totally reflected at the interface between the ZnO layer 24 and air and can be extracted from the semiconductor light-emitting element 10. That is, if the periodic interval $L_z$ is in the range given by a formula (3) shown below, $$\frac{m\lambda}{n_{z\lambda}} \leq L_z \leq \frac{m\lambda}{n_{z\lambda}(1-\sin\theta_z)} \quad (3)$$

the diffracted light 50 and the diffracted light 52 that mutually reinforce are emitted out of the semiconductor light-emitting element 10. Since intensity of the primary diffracted light is the substantially strongest, the periodic interval $L_z$ may be set by setting m=1. That is, it is desirable to set the periodic interval $L_z$ so that a formula (4) shown below is satisfied:

$$\frac{\lambda}{n_{z\lambda}} \leq L_z \leq \frac{\lambda}{n_{z\lambda}(1-\sin\theta_z)} \quad (4)$$

Calculation of the periodic interval $L_z$ using the above formula (4) assuming, for example, that the wavelength $\lambda=450$ nm, the index of refraction $n_{z\lambda}$ of ZnO is 2.3, m=1, and $\theta_z=25.8°$ yields 196 nm $\leq L_z \leq$ 346 nm.

Since, in contract to semiconductor lasers, emission spectra of semiconductor light-emitting elements are broad, the periodic interval $L_z$ may be set by considering the half value width $\Delta\lambda$ in the air. That is, luminous efficiency is still improved even if the periodic interval $L_z$ is set by adjusting to the wavelength $\lambda\pm\Delta\lambda$ shifted from the light emission peak wavelength $\lambda$ by $\Delta\lambda$. Here, the half value width $\Delta\lambda$ is the width of wavelength from the light emission peak wavelength $\lambda$ to a wavelength where luminous intensity reduces by half. The range of periodic interval $L_z$ when the half value width $\Delta\lambda$ is considered can be represented by a formula (5) shown below:

$$\min\left\{\begin{array}{c}\frac{m\lambda}{n_{z\lambda}},\\ \frac{m(\lambda-\Delta\lambda)}{n_{z(\lambda-\Delta\lambda)}},\\ \frac{m(\lambda+\Delta\lambda)}{n_{z(\lambda+\Delta\lambda)}}\end{array}\right\} \leq L_z \leq \max\left\{\begin{array}{c}\frac{m\lambda}{n_{z\lambda}(1-\sin\theta_z)},\\ \frac{m(\lambda-\Delta\lambda)}{n_{z(\lambda-\Delta\lambda)}(1-\sin\theta_z)},\\ \frac{m(\lambda+\Delta\lambda)}{n_{z(\lambda+\Delta\lambda)}(1-\sin\theta_z)}\end{array}\right\} \quad (5)$$

wherein $n_{z(\lambda-\Delta\lambda)}$ denotes the index of refraction of the ZnO layer at the wavelength $\lambda-\Delta\lambda$ and $n_{z(\lambda+\Delta\lambda)}$ denotes the index of refraction of the ZnO layer at the wavelength $\lambda+\Delta\lambda$. Also here, since intensity of the primary diffracted light is the substantially strongest, the periodic interval $L_z$ may be set by setting m=1. That is, it is desirable to set the periodic interval $L_z$ so that a formula (6) shown below is satisfied:

$$\min\left\{\begin{array}{c}\dfrac{\lambda}{n_{z\lambda}}, \\ \dfrac{\lambda-\Delta\lambda}{n_{z(\lambda-\Delta\lambda)}}, \\ \dfrac{\lambda+\Delta\lambda}{n_{z(\lambda+\Delta\lambda)}}\end{array}\right\} \leqq L_z \leqq \max\left\{\begin{array}{c}\dfrac{\lambda}{n_{z\lambda}(1-\sin\theta_z)}, \\ \dfrac{\lambda-\Delta\lambda}{n_{z(\lambda-\Delta\lambda)}(1-\sin\theta_z)}, \\ \dfrac{\lambda+\Delta\lambda}{n_{z(\lambda+\Delta\lambda)}(1-\sin\theta_z)}\end{array}\right\} \quad (6)$$

In this case, if the wavelength $\lambda$=450 nm, the half value width $\Delta\lambda$ is 15 nm, and $\theta_z$=25.8°, and the index of refraction $n_{z\lambda}$ of ZnO at wavelength $\lambda$ and the index of refraction $n_{z(\lambda\pm\Delta\lambda)}$ of ZnO at wavelength $\lambda\pm\Delta\lambda$ are equal and both are 2.3, the periodic interval $L_z$ can be calculated as 189 nm$\leqq L_z \leqq$358 nm from the formula (6).

Further, it is most desirable, as described above, that the angle $\theta_m$ at which the diffracted light 50 and the diffracted light 52 mutually reinforce is smaller than the total reflection angle $\theta_z$, but luminous efficiency is substantially improved if $\theta_m$ is smaller than a value twice $\theta_z$. That is, $\theta_m$ may be in the range of $0 \leqq \theta_m \leqq 2\theta_z$. At this time, the range of the periodic interval $L_z$ can be represented as shown below:

$$\min\left\{\begin{array}{c}\dfrac{m\lambda}{n_{z\lambda}}, \\ \dfrac{m(\lambda-\Delta\lambda)}{n_{z(\lambda-\Delta\lambda)}}, \\ \dfrac{m(\lambda+\Delta\lambda)}{n_{z(\lambda+\Delta\lambda)}}\end{array}\right\} \leqq L_z \leqq \max\left\{\begin{array}{c}\dfrac{m\lambda}{n_{z\lambda}(1-\sin 2\theta_z)}, \\ \dfrac{m(\lambda-\Delta\lambda)}{n_{z(\lambda-\Delta\lambda)}(1-\sin 2\theta_z)}, \\ \dfrac{m(\lambda+\Delta\lambda)}{n_{z(\lambda+\Delta\lambda)}(1-\sin 2\theta_z)}\end{array}\right\} \quad (7)$$

Also here, since intensity of the primary diffracted light is the substantially strongest, the periodic interval $L_z$ may be set by setting m=1. That is, the periodic interval $L_z$ may be set so that a formula (8) shown below is satisfied:

$$\min\left\{\begin{array}{c}\dfrac{\lambda}{n_{z\lambda}}, \\ \dfrac{\lambda-\Delta\lambda}{n_{z(\lambda-\Delta\lambda)}}, \\ \dfrac{\lambda+\Delta\lambda}{n_{z(\lambda+\Delta\lambda)}}\end{array}\right\} \leqq L_z \leqq \max\left\{\begin{array}{c}\dfrac{\lambda}{n_{z\lambda}(1-\sin 2\theta_z)}, \\ \dfrac{\lambda-\Delta\lambda}{n_{z(\lambda-\Delta\lambda)}(1-\sin 2\theta_z)}, \\ \dfrac{\lambda+\Delta\lambda}{n_{z(\lambda+\Delta\lambda)}(1-\sin 2\theta_z)}\end{array}\right\} \quad (8)$$

In this case, if the wavelength $\lambda$=450 nm, the half value width $\Delta\lambda$ is 15 nm, and $\theta_z$=25.8°, and the index of refraction $n_{z\lambda}$ of ZnO at wavelength $\lambda$ and the index of refraction $n_{z(\lambda\pm\Delta\lambda)}$ of ZnO at wavelength $\lambda\pm\Delta\lambda$ are equal and both are 2.3, the periodic interval $L_z$ can be calculated as 189 nm$\leqq L_z \leqq$935 nm from the formula (8).

In the first embodiment, formation of concave portions on the surface of the ZnO layer 24 has been described, but light extraction efficiency can similarly be improved by forming, instead of concave portions, convex portions on the surface of the ZnO layer 24. Also, light emission in the air from the semiconductor light-emitting element 10 has been described above, but the semiconductor light-emitting element 10 may be wrapped in phosphor or optically transparent resin. In such a case, the above formulae (3) to (8) can be applied by using the index of refraction of phosphor or optically transparent resin, which is a medium in contact with the ZnO layer 24, instead of the index of refraction of air, when determining the total reflection angle $\theta_z$.

Second Embodiment

Figure 6:
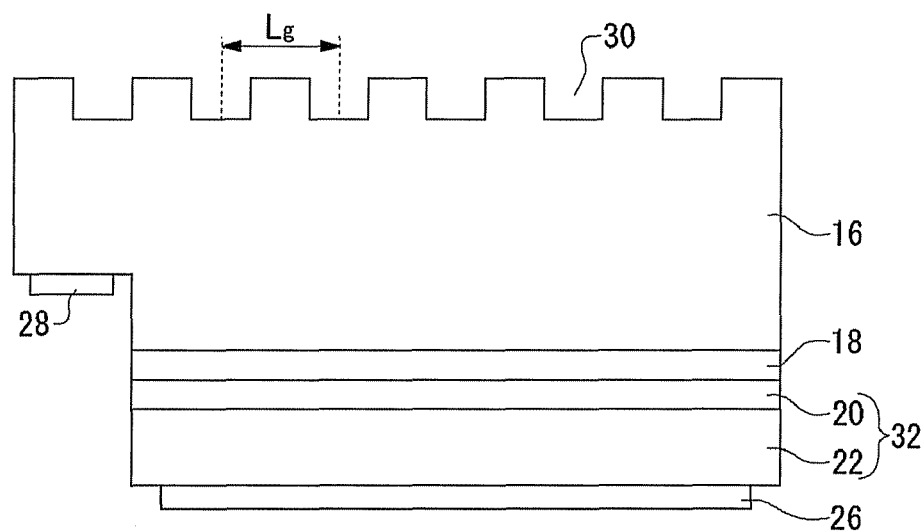
FIG. 6 is a cross-sectional view of a semiconductor light-emitting element according to a second embodiment of the present invention.

FIG. 6 is a cross-sectional view of a semiconductor light-emitting element according to a second embodiment of the present invention. As shown in FIG. 6, a semiconductor light-emitting element 60 is a GaN based semiconductor light-emitting element of the double heterostructure in which the p-type GaN layer 32 consisting of the p-type GaN 22, which is a contact layer and the p-type AlGaN layer 20, which is a clad layer, InGaN emission layer 18, and n-type GaN layer 16, which is a contact layer, are laminated. The observation surface of light emission of the semiconductor light-emitting element 60 according to the second embodiment is the n-type GaN layer 16 side.

The semiconductor light-emitting element 60 according to the second embodiment is formed first by laminating the n-type GaN layer 16, InGaN emission layer 18, p-type AlGaN layer 20, and p-type GaN 22 on a sapphire substrate. Up to here, the process is the same as that for the semiconductor light-emitting element 10 according to the first embodiment, but hereafter, the sapphire substrate and a buffer layer are separated by laser liftoff. A KrF laser of the wavelength 248 nm can be used as a laser.

A plurality of concave portions 30 are formed at two-dimensional periodic intervals on the surface of the n-type GaN layer 16 exposed by separating the sapphire substrate and the buffer layer. The surface of the n-type GaN layer 16 refers to a surface opposite to the surface where the InGaN emission layer 18 and the n-type GaN layer 16 are in contact. The concave portions 30 may be arranged and formed, as shown in FIG. 2, like a tetragonal lattice. Also, the concave portions 30 may be arranged and formed, as shown in FIG. 3, like a triangle lattice.

The plane view shape of the concave portions 30 may be circular, as shown, for example, in FIG. 2 or FIG. 3, or quadrilateral or hexagonal. The diameter thereof or the length of one side may be about 100 nm. The depth of the concave portions 30 may be about 500 nm.

As in the semiconductor light-emitting element 10 according to the first embodiment, the concave portions 30 can be formed by performing drying etching such as the RIE process. By performing dry etching on the n-type GaN layer 16, nitrogen holes are generated. Then the surface of the n-type GaN layer 16 is converted to the n type. However, the n-type GaN layer 16 is originally of n type and thus is not reverse-biased and the forward voltage does not increase.

After forming the concave portions 30, partial areas of the p-type GaN layer 22, p-type AlGaN layer 20, InGaN emission layer 18, and n-type GaN layer 16 are removed by etching. The n-type GaN layer 16 is halfway etched and then the n-side electrode 28 is formed on the top surface of the exposed n-type GaN layer 16.

Subsequently, the p-side electrode 26 is formed on the p-type GaN layer 22. Since the semiconductor light-emitting element 60 has the observation surface of light emission on the n-type GaN layer 16 side, there is no need to form a transparent electrode layer of ZnO on the p-type GaN layer 22 and the p-side electrode 26 is formed directly on the n-type GaN layer 16. The p-side electrode 26 desirably uses Pt/Au. The p-side electrode 26 may have the thickness of about 1000 Å for Pt and about 3000 Å for Au.

The semiconductor light-emitting element 60 according to the second embodiment has concave portions formed on the surface of the n-type GaN layer 16 at two-dimensional periodic intervals. Therefore light from the InGaN emission layer 18 is diffracted. Of all diffracted lights, a diffracted light incident on the interface at an angle smaller than a total reflection angle $\theta_g$ at the interface between the n-type GaN layer 16 and air is extracted from the semiconductor light-emitting element 60 without being totally reflected. Thus light extraction efficiency can be improved.

It is desirable to set a periodic interval $L_g$ of the concave portions 30 in the range satisfying a formula (9) show below:

$$\frac{\lambda}{n_{g\lambda}} \leq L_g \leq \frac{\lambda}{n_{g\lambda}(1-\sin\theta_g)} \quad (9)$$

wherein λ denotes the peak wavelength of light from the InGaN emission layer 18 in the air and $n_{g\lambda}$ denotes the index of refraction of the n-type GaN layer 16 at the wavelength λ.

By forming the concave portions 30 on the surface of the n-type GaN layer 16 at the periodic interval $L_g$ satisfying the formula (9), diffracted light can be extracted from the semiconductor light-emitting element 60, thereby improving light extraction efficiency. Calculation of the periodic interval $L_g$ using the above formula (9) assuming, for example, that the wavelength λ=450 nm, the index of refraction $n_{g\lambda}$ of the n-type GaN layer 16 is 2.5, and the total reflection angle $\theta_g$=23.6° yields 180 nm≦$L_g$≦300 nm.

Also, as in the first embodiment, light extraction efficiency can be improved by setting the periodic interval $L_g$ in consideration for the half value width Δλ of the semiconductor light-emitting element 60. That is, the periodic interval $L_g$ between adjacent concave portions 30 may be in the range of a formula (10) shown below:

$$\min\left\{\begin{array}{c}\frac{\lambda}{n_{g\lambda}},\\ \frac{\lambda-\Delta\lambda}{n_{g(\lambda-\Delta\lambda)}},\\ \frac{\lambda+\Delta\lambda}{n_{g(\lambda+\Delta\lambda)}}\end{array}\right\} \leq L_g \leq \max\left\{\begin{array}{c}\frac{\lambda}{n_{g\lambda}(1-\sin\theta_g)},\\ \frac{\lambda-\Delta\lambda}{n_{g(\lambda-\Delta\lambda)}(1-\sin\theta_g)},\\ \frac{\lambda+\Delta\lambda}{n_{g(\lambda+\Delta\lambda)}(1-\sin\theta_g)}\end{array}\right\} \quad (10)$$

wherein $n_{g(\lambda-\Delta\lambda)}$ denotes the index of refraction of the n-type GaN layer 16 at the wavelength λ−Δλ and $n_{g(\lambda+\Delta\lambda)}$ denotes the index of refraction of the n-type GaN layer 16 at the wavelength λ+Δλ.

Further, as in the first embodiment, even if the angle $\theta_m$ at which diffracted lights mutually reinforce is in the range of 0≦$\theta_m$≦2$\theta_g$, light extraction efficiency can still be improved. That is, the periodic interval $L_g$ between adjacent concave portions 30 may be in the range of a formula (11) shown below:

$$\min\left\{\begin{array}{c}\frac{\lambda}{n_{g\lambda}},\\ \frac{\lambda-\Delta\lambda}{n_{g(\lambda-\Delta\lambda)}},\\ \frac{\lambda+\Delta\lambda}{n_{g(\lambda+\Delta\lambda)}}\end{array}\right\} \leq L_g \leq \max\left\{\begin{array}{c}\frac{\lambda}{n_{g\lambda}(1-\sin 2\theta_g)},\\ \frac{\lambda-\Delta\lambda}{n_{g(\lambda-\Delta\lambda)}(1-\sin 2\theta_g)},\\ \frac{\lambda+\Delta\lambda}{n_{g(\lambda+\Delta\lambda)}(1-\sin 2\theta_g)}\end{array}\right\} \quad (11)$$

Figure 7:
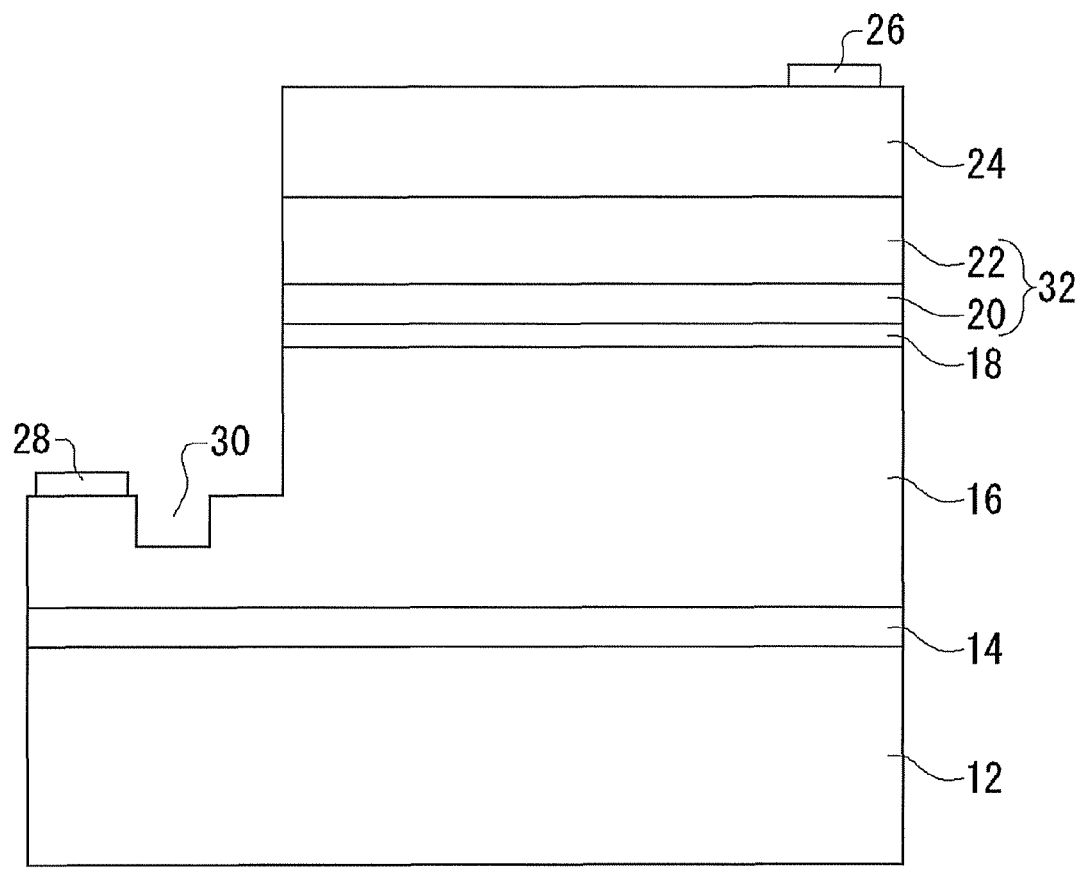
FIG. 7 is a diagram showing a modified example of the semiconductor light-emitting element according to the second embodiment of the present invention.

FIG. 7 is a diagram showing a modified example of the semiconductor light-emitting element according to the second embodiment of the present invention. In a semiconductor light-emitting element 62 shown in FIG. 7, the sapphire substrate 12 and buffer layer 14 are not separated. The concave portions 30 is formed on the surface of the n-type GaN layer 16 exposed by etching the n-type GaN layer 16 halfway from the ZnO layer 24 side other than an area where the n-side electrode 28 is formed. Though only one concave portion 30 is depicted in FIG. 7 because the concave portion 30 is depicted by enlarging the size of it, actually a plurality of concave portions 30 are formed.

If light emitted by the InGaN emission layer 18 and reflected by the interface between the buffer layer 14 and the sapphire substrate 12 is incident on an area where the concave portions 30 are formed, the light is diffracted by the concave portions 30. And its traveling direction changes so that the light can be extracted from the semiconductor light-emitting element 62 without being totally reflected. The concave portions 30 are formed on the n-type GaN layer 16 also in the semiconductor light-emitting element 62. Therefore the forward voltage is not caused to increase due to the fact that the surface of the n-type GaN layer 16 is converted to n-type.

In the second embodiment, formation of concave portions on the surface of the n-type GaN layer 16 has been described, but light extraction efficiency can similarly be improved by forming, instead of concave portions, convex portions on the surface of the n-type GaN layer 16. Also, light emission in the air from the semiconductor light-emitting element 60 or 62 has been described above, but the semiconductor light-emitting element 60 or 62 may be wrapped in phosphor or optically transparent resin. In such a case, the above formulae (9) to (11) can be applied by using the index of refraction of phosphor or optically transparent resin, which is a medium in contact with the n-type GaN layer 16, instead of the index of refraction of air, when determining the total reflection angle $\theta_g$.

Third Embodiment

Figure 8:
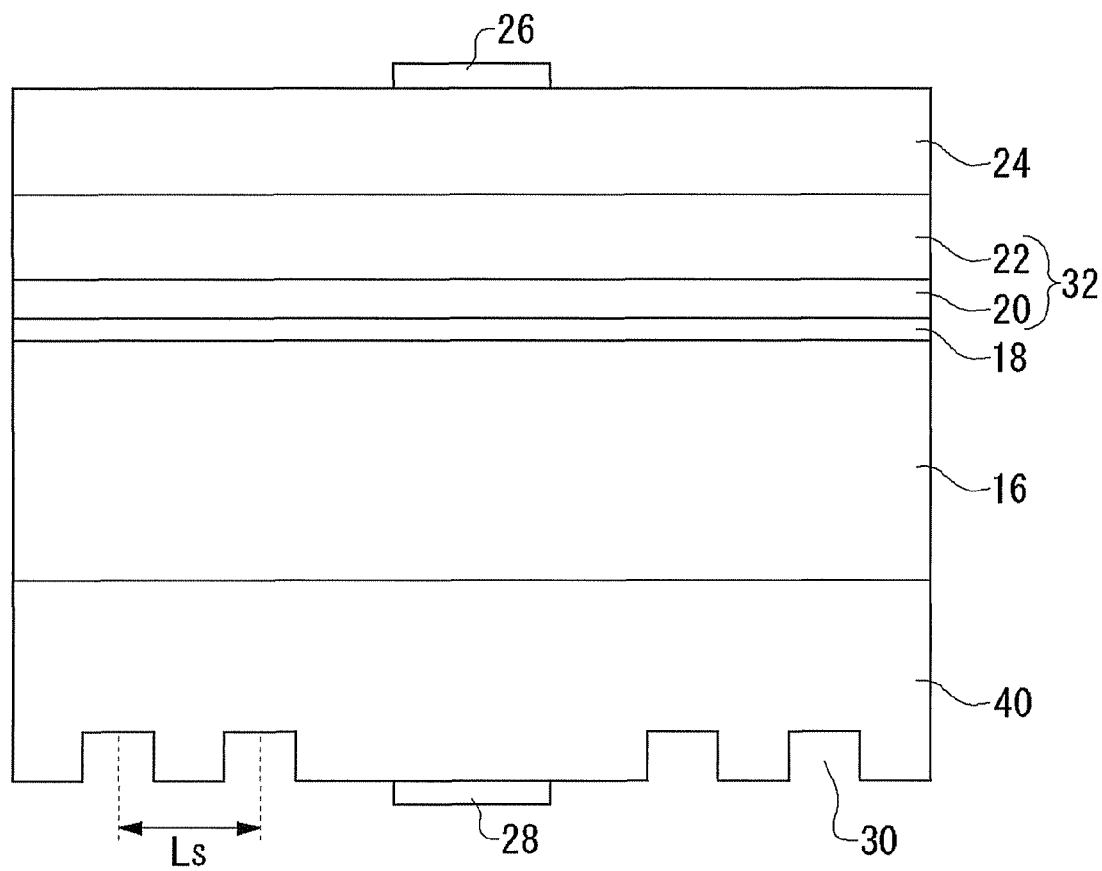
FIG. 8 is a cross-sectional view of a semiconductor light-emitting element according to a third embodiment of the present invention.

FIG. 8 is a cross-sectional view of a semiconductor light-emitting element according to a third embodiment of the present invention. As shown in FIG. 8, a semiconductor light-emitting element 70 is a GaN based semiconductor light-emitting element of the double heterostructure in which the n-type GaN layer 16, which is a contact layer, the InGaN emission layer 18, and the p-type GaN layer 32 consisting of the p-type AlGaN layer 20, which is a clad layer, and the p-type AlGaN layer 22, which is a contact layer, are laminated on an SiC substrate 40. The observation surface of light emission of the semiconductor light-emitting element 70 is the ZnO layer 24 side or the SiC substrate 40 side. If the ZnO layer 24 side is to be the observation surface of light emission, a reflector (not shown) made of, for example, silver (Ag) should be provided between the SiC substrate 40 and the mounting substrate when using the semiconductor light-emitting element 70. By providing the reflector, light emitted from the SiC substrate 40 side can be made to be reflected to the ZnO layer 24 side, which is the observation surface of light emission.

The semiconductor light-emitting element 70 according to the third embodiment is formed by epitaxially growing a GaN based semiconductor on the SiC substrate 40 and subsequently the concave portions 30 are formed on the surface of the SiC substrate 40. The ZnO layer 24 functioning as a transparent electrode on the ZnO layer 24 is provided, but no concave portion is formed on the ZnO layer 24.

In contrast to sapphire, SiC is electrically conductive and a process of forming an n-side electrode connected to the n-type GaN layer 16 by etching the p-type GaN layer or the InGaN emission layer as in the first or second embodiment is unnecessary. Simplification of manufacturing processes and improvement of reliability can be achieved.

A plurality of concave portions 30 are formed on the surface of the SiC substrate 40 at two-dimensional periodic intervals. The surface of the SiC substrate 40 refers to a surface opposite to the surface where the n-type GaN layer 16 and the SiC substrate 40 are in contact. The concave portions 30 may be arranged and formed, as shown in FIG. 2, like a tetragonal lattice. Also, the concave portions 30 may be arranged and formed, as shown in FIG. 3, like a triangle lattice.

The plane view shape of the concave portions 30 may be circular, as shown, for example, in FIG. 2 or FIG. 3, or quadrilateral or hexagonal. The diameter thereof or the length of one side may be about 100 nm. The depth of the concave portions 30 may be about 500 nm.

As in the semiconductor light-emitting element 10 according to the first embodiment, the concave portions 30 can be formed by performing drying etching such as the RIE process. Performing dry etching on the SiC substrate 40 does not cause a problem of an increased forward voltage due to plasma damage.

The n-side electrode 28 is provided in a partial area on the SiC substrate 40 where no concave portion 30 is formed. The n-side electrode 28 is desirably formed near a center on the surface of the SiC substrate 40. The n-side electrode 28 functions also as a reflective layer and can use Ni, Ti, Ni/Ti/Au, or an NiTi alloy. The n-side electrode 28 may have the thickness of about 2500 Å.

The p-side electrode 26 is formed in a partial area on the ZnO layer 24. When the SiC substrate 40 is used as a substrate, it is desirable to form the p-side electrode 26 near the center on the surface of the ZnO layer 24. The p-side electrode 26 desirably uses Pt/Au or the like. The p-side electrode 26 may have the thickness of about 1000 Å for Pt and about 3000 Å for Au.

The semiconductor light-emitting element 70 according to the third embodiment has concave portions formed on the surface of the SiC substrate 40 at two-dimensional periodic intervals. Therefore light emitted from the InGaN emission layer 18 in the direction of the SiC substrate 40 is diffracted at the interface between the SiC substrate 40 and air. Light diffracted in the direction of an angle smaller than a total reflection angle $\theta_s$ with respect to a normal line of the SiC substrate 40 can be extracted from the semiconductor light-emitting element 70 without being totally reflected at the interface between the SiC substrate 40 and air, thereby improving light extraction efficiency.

It is desirable to set a periodic interval $L_s$ of the concave portions 30 in the range satisfying a formula (12) show below:

$$\frac{\lambda}{n_{s\lambda}} \leq L_s \leq \frac{\lambda}{n_{s\lambda}(1-\sin\theta_s)} \quad (12)$$

wherein $\lambda$ denotes the peak wavelength of light from the InGaN emission layer 18 in the air, $n_{s\lambda}$ denotes the index of refraction of the SiC substrate 40 at the wavelength $\lambda$, and $\theta_s$ denotes the total reflection angle at the interface between the SiC substrate 40 and air.

By forming the concave portions 30 at the periodic interval $L_s$ satisfying the formula (12), diffracted light can be extracted from the semiconductor light-emitting element 70, thereby improving light extraction efficiency. Calculation of the periodic interval $L_s$ using the above formula (12) assuming, for example, that the wavelength $\lambda$=450 nm, the index of refraction $n_{s\lambda}$ of the SiC substrate 40 is 2.65, and $\theta_s$=22.2° yields 170 nm$\leq L_s \leq$273 nm.

Also, light extraction efficiency can be improved by setting the periodic interval $L_s$ in consideration for the half value width $\Delta\lambda$ of the semiconductor light-emitting element 70. That is, the periodic interval $L_s$ between adjacent concave portions 30 may be in the range of a formula (13) shown below:

$$\min\left\{\begin{array}{c}\frac{\lambda}{n_{s\lambda}},\\ \frac{\lambda-\Delta\lambda}{n_{s(\lambda-\Delta\lambda)}},\\ \frac{\lambda+\Delta\lambda}{n_{s(\lambda+\Delta\lambda)}}\end{array}\right\} \leq L_s \leq \max\left\{\begin{array}{c}\frac{\lambda}{n_{s\lambda}(1-\sin\theta_s)},\\ \frac{\lambda-\Delta\lambda}{n_{s(\lambda-\Delta\lambda)}(1-\sin\theta_s)},\\ \frac{\lambda+\Delta\lambda}{n_{s(\lambda+\Delta\lambda)}(1-\sin\theta_s)}\end{array}\right\} \quad (13)$$

wherein $n_{s(\lambda-\Delta\lambda)}$ denotes the index of refraction of the SiC substrate 40 at the wavelength $\lambda-\Delta\lambda$ and $n_{s(\lambda+\Delta\lambda)}$ denotes the index of refraction of the SiC substrate 40 at the wavelength $\lambda+\Delta\lambda$.

Further, even if the angle $\theta_m$ at which diffracted lights mutually reinforce is in the range of $0 \leq \theta_m \leq 2\theta_s$, light extraction efficiency can still be improved. That is, the periodic interval $L_s$, between adjacent concave portions 30 may be in the range of a formula (14) shown below:

$$\min\left\{\begin{array}{c}\frac{\lambda}{n_{s\lambda}},\\ \frac{\lambda-\Delta\lambda}{n_{s(\lambda-\Delta\lambda)}},\\ \frac{\lambda+\Delta\lambda}{n_{s(\lambda+\Delta\lambda)}}\end{array}\right\} \leq L_s \leq \max\left\{\begin{array}{c}\frac{\lambda}{n_{s\lambda}(1-\sin 2\theta_s)},\\ \frac{\lambda-\Delta\lambda}{n_{s(\lambda-\Delta\lambda)}(1-\sin 2\theta_s)},\\ \frac{\lambda+\Delta\lambda}{n_{s(\lambda+\Delta\lambda)}(1-\sin 2\theta_s)}\end{array}\right\} \quad (14)$$

In the third embodiment, formation of concave portions on the surface of the SiC substrate 40 has been described, but light extraction efficiency can similarly be improved by forming, instead of concave portions, convex portions on the surface of the SiC substrate 40. Also, light emission in the air from the semiconductor light-emitting element 70 has been described above, but the semiconductor light-emitting element 70 may be wrapped in phosphor or optically transparent resin. In such a case, the above formulae (12) to (14) can be applied by using the index of refraction of phosphor or optically transparent resin, which is a medium in contact with the SiC substrate 40, instead of air.

Fourth Embodiment

Figure 9:
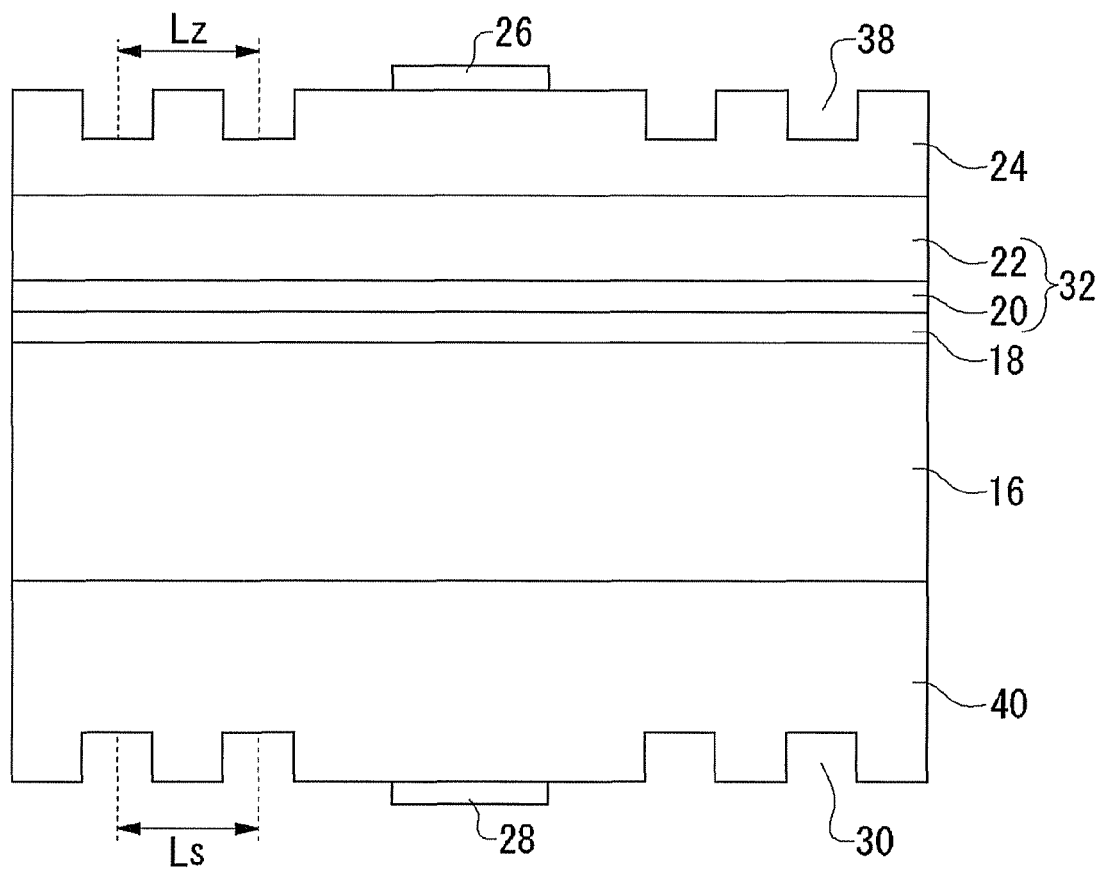
FIG. 9 is a cross-sectional view of a semiconductor light-emitting element according to a fourth embodiment of the present invention.

FIG. 9 is a cross-sectional view of a semiconductor light-emitting element according to a fourth embodiment of the present invention. As shown in FIG. 9, a semiconductor light-emitting element 80 is a GaN based semiconductor light-emitting element of the double heterostructure in which the n-type GaN layer 16, which is a contact layer, the InGaN emission layer 18, and the p-type GaN layer 32 consisting of the p-type AlGaN layer 20, which is a clad layer, and the p-type AlGaN layer 22, which is a contact layer, are laminated on the SiC substrate 40. The observation surface of light emission of the semiconductor light-emitting element 80 according to the fourth embodiment of the present invention is the ZnO layer 24 side or the SiC substrate 40 side. As in the third embodiment, a reflector may be provided for implementation.

The semiconductor light-emitting element 80 according to the fourth embodiment is different from the semiconductor light-emitting element 70 according to the third embodiment in that concave portions 38 are formed on the surface of the ZnO layer 24 provided on the p-type GaN layer 22. As in the third embodiment, the concave portions 30 are formed on the surface of the SiC substrate 40.

A plurality of the concave portions 38 are formed on the surface of the ZnO layer 24 at two-dimensional periodic intervals. The surface of the ZnO layer 24 refers to a surface opposite to the surface where the ZnO layer 24 and the p-type GaN layer 22 are in contact. The arrangements and shapes of the concave portions 38 are similar to those of the semiconductor light-emitting element 10 according to the first embodiment and the periodic interval $L_z$ can be set by applying the formulae (3) to (8). However, if the SiC substrate 40 is used as a substrate, the p-side electrode 26 is desirably formed near the center on the surface of the ZnO layer 24.

The semiconductor light-emitting element 80 according to the fourth embodiment has the concave portions 38 formed on the surface of the ZnO layer 24 at two-dimensional periodic intervals. Therefore light emitted from the InGaN emission layer 18 in the direction of the ZnO layer 24 is diffracted. Of all diffracted lights, a diffracted light incident on the interface between the ZnO layer 24 and air at an angle smaller than the total reflection angle $\theta_z$ at the interface can be extracted from the semiconductor light-emitting element 80 without being totally reflected. Effects of the concave portions 30 formed on the surface of the SiC substrate 40 are the same as those in the semiconductor light-emitting element 70 according to the third embodiment.

In the semiconductor light-emitting element 80 according to the fourth embodiment, as in the first embodiment, concave portions are formed on the ZnO layer 24, instead of the p-type GaN layer 22, and conversion of the surface of the p-type GaN layer 22 to the n type due to plasma damage during dry etching does not occur. Thus the forward voltage does not increase. Moreover, as in the third embodiment, even if dry etching is performed on the SiC substrate 40, the forward voltage does not increase due to plasma damage.

While the invention has been described according to the embodiments, the embodiments is for illustrative purposes only, and a person skilled in the art will understand that changes and variations of combinations of these components and processes may be made without departing from the spirit or scope of the present invention.

The invention claimed is:

1. A semiconductor light-emitting element in which an n-type GaN layer, an emission layer, and a p-type GaN layer are laminated on a substrate, wherein:
    an $Mg_xZn_{1-x}O$ layer ($0 \leq x \leq 0.5$) is provided on the p-type GaN layer;
    concave or convex portions are formed on a surface of the $Mg_xZn_{1-x}O$ layer ($0 \leq x \leq 0.5$) at two-dimensional periodic intervals; and
    if a wavelength of light from the emission layer in the air is $\lambda$, an index of refraction of the $Mg_xZn_{1-x}O$ layer ($0 \leq x \leq 0.5$) at the wavelength $\lambda$ is $n_{z\lambda}$, and a total reflection angle at an interface between the $Mg_xZn_{1-x}O$ layer ($0 \leq x \leq 0.5$) and a medium in contact therewith is periodic interval $L_z$ between adjacent concave portions or that between adjacent convex portions is in a range of $$\frac{\lambda}{n_{z\lambda}} \leq L_z \leq \frac{\lambda}{n_{z\lambda}(1-\sin\theta_z)}.$$

2. The semiconductor light-emitting element according to claim 1, wherein concave or convex portions formed on the $Mg_xZn_{1-x}O$ layer ($0 \leq x \leq 0.5$) are arranged into a tetragonal lattice or triangle lattice form.

3. A semiconductor light-emitting element in which a p-type GaN layer, an emission layer, and an n-type GaN layer are laminated, wherein:
    concave or convex portions are formed on a surface of the n-type GaN layer at two-dimensional periodic intervals; and
    if a wavelength of light from the emission layer in the air is $\lambda$, an index of refraction of the n-type GaN layer at the wavelength $\lambda$ is $n_{g\lambda}$, and a total reflection angle at an interface between the n-type GaN layer and a medium in contact therewith is $\theta_g$, a periodic interval $L_g$ between adjacent concave portions or that between adjacent convex portions is in a range of $$\frac{\lambda}{n_{g\lambda}} \leq L_g \leq \frac{\lambda}{n_{g\lambda}(1-\sin\theta_g)}.$$

4. The semiconductor light-emitting element according to claim 3, wherein
    concave or convex portions formed on the n-type GaN layer are arranged into a tetragonal lattice or triangle lattice form.

5. A semiconductor light-emitting element in which an n-type GaN layer, an emission layer, and a p-type GaN layer are laminated on a substrate, wherein:
    the substrate is an SiC substrate;
    concave or convex portions are formed on a surface of the SiC substrate at two-dimensional periodic intervals; and
    if a wavelength of light from the emission layer in the air is $\lambda$, an index of refraction of the SiC substrate at the wavelength $\lambda$ is $n_{s\lambda}$, a half value width of light from the emission layer in the air is $\Delta\lambda$, the index of refraction of the SiC substrate at the wavelength $\lambda - \Delta\lambda$ is $n_{s(\lambda-\Delta\lambda)}$, the index of refraction of the SiC substrate at the wavelength $\lambda + \Delta\lambda$ is $n_{s(\lambda+\Delta\lambda)}$, and a total reflection angle at an interface between the SiC substrate and a medium in contact therewith is $\theta_s$, a periodic interval $L_s$ between adjacent concave portions or that between adjacent convex portions is in a range of $$\min\left\{\begin{array}{c}\frac{\lambda}{n_{s\lambda}}, \\ \frac{\lambda-\Delta\lambda}{n_{s(\lambda-\Delta\lambda)}}, \\ \frac{\lambda+\Delta\lambda}{n_{s(\lambda+\Delta\lambda)}}\end{array}\right\} \leq L_s \leq \max\left\{\begin{array}{c}\frac{\lambda}{n_{s\lambda}(1-\sin 2\theta_s)}, \\ \frac{\lambda-\Delta\lambda}{n_{s(\lambda-\Delta\lambda)}(1-\sin 2\theta_s)}, \\ \frac{\lambda+\Delta\lambda}{n_{s(\lambda+\Delta\lambda)}(1-\sin 2\theta_s)}\end{array}\right\}$$

6. The semiconductor light-emitting element according to claim 5, wherein
    concave or convex portions formed on the SiC substrate are arranged into a tetragonal lattice or triangle lattice form.

7. A semiconductor light-emitting element in which an n-type GaN layer, an emission layer, and a p-type GaN layer are laminated on a substrate, wherein:
    the substrate is an SiC substrate;
    concave or convex portions are formed on a surface of the SiC substrate at two-dimensional periodic intervals;
    a $Mg_xZn_{1-x}O$ layer ($0 \leq x \leq 0.5$) is provided on the p-type GaN layer;
    concave or convex portions are formed on the surface of the $Mg_xZn_{1-x}O$ layer ($0 \leq x \leq 0.5$) at two-dimensional periodic intervals; and
    if a wavelength of light from the emission layer in the air is $\lambda$, an index of refraction of the $Mg_xZn_{1-x}O$ layer ($0 \leq x \leq 0.5$) at the wavelength $\lambda$ is $n_{z\lambda}$, and a total reflection angle at an interface between the $Mg_xZn_{1-x}O$ layer ($0 \leq x \leq 0.5$) and a medium in contact therewith is $\theta_z$, a periodic interval $L_z$ between adjacent concave portions or that between adjacent convex portions is in a range of $$\frac{\lambda}{n_{z\lambda}} \leq L_z \leq \frac{\lambda}{n_{z\lambda}(1-\sin\theta_z)}.$$

8. The semiconductor light-emitting element according to claim 7, wherein concave or convex portions formed on the $Mg_xZn_{1-x}O$ layer ($0 \leq x \leq 0.5$) are arranged into a tetragonal lattice or triangle lattice form.

* * * * *